(12) United States Patent
Mittelholzer et al.

(10) Patent No.: US 9,734,010 B2
(45) Date of Patent: *Aug. 15, 2017

(54) DATA ENCODING IN SOLID-STATE STORAGE APPARATUS

(71) Applicant: International Business Machines Corporation, Armonk, NY (US)

(72) Inventors: Thomas Mittelholzer, Rueschlikon (CH); Nikolaos Papandreou, Rueschlikon (CH); Charalampos Pozidis, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/225,856

(22) Filed: Aug. 2, 2016

(65) Prior Publication Data

US 2016/0342466 A1    Nov. 24, 2016

Related U.S. Application Data

(63) Continuation of application No. 14/496,416, filed on Sep. 25, 2014, now Pat. No. 9,502,138.

(30) Foreign Application Priority Data

Nov. 28, 2013  (GB) ................................. 1320983.8

(51) Int. Cl.
*G11C 29/00*  (2006.01)
*G06F 11/10*  (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
None
See application file for complete search history.

(56) References Cited

U.S. PATENT DOCUMENTS

| | | | |
|---|---|---|---|
| 8,989,317 B1* | 3/2015 | Holden | ............... H04L 25/0272 375/295 |
| 2005/0138518 A1* | 6/2005 | Cideciyan | .......... G11B 20/1833 714/752 |

(Continued)

OTHER PUBLICATIONS

List of IBM Patents or Patent Applications Treated as Related—Date Filed: Aug. 2, 2016; 2 pages.

(Continued)

*Primary Examiner* — Daniel McMahon
(74) *Attorney, Agent, or Firm* — Cantor Colburn LLP

(57) ABSTRACT

A method for encoding an input data block for storage in q-level cells of solid-state memory includes producing a preliminary block from the input data block by modulation encoding at least part of the input block into a first group of $q^{ary}$ symbols via a first drift-tolerant encoding scheme, the preliminary block comprising the first group of $q^{ary}$ symbols and any remainder of the input block not encoded via the first encoding scheme; generating parity data for the preliminary block via an error-correction encoding scheme; modulation encoding the parity data and any remainder of the input block into a second group of $q^{ary}$ symbols via a second drift-tolerant encoding scheme; and supplying the $q^{ary}$ symbols of the first and second groups for storage in respective q-level memory cells.

18 Claims, 9 Drawing Sheets

(51) Int. Cl.
*H03M 13/13* (2006.01)
*H03M 13/00* (2006.01)
*G06F 3/06* (2006.01)
*G11C 29/52* (2006.01)
*H03M 13/15* (2006.01)

(52) U.S. Cl.
CPC ............ *G06F 3/0679* (2013.01); *G11C 29/52* (2013.01); *G11C 29/70* (2013.01); *H03M 13/13* (2013.01); *H03M 13/63* (2013.01); *H03M 13/152* (2013.01)

(56) References Cited

U.S. PATENT DOCUMENTS

| | | | |
|---|---|---|---|
| 2009/0125780 A1* | 5/2009 | Taylor | H03M 13/1137 714/752 |
| 2009/0132895 A1* | 5/2009 | Jiang | G06F 11/1072 714/781 |
| 2009/0207933 A1* | 8/2009 | Ragot | H03M 7/00 375/295 |
| 2012/0213299 A1* | 8/2012 | Cronie | H04L 1/0041 375/259 |
| 2013/0194864 A1* | 8/2013 | Bandic | G11C 11/5678 365/185.03 |
| 2013/0194865 A1* | 8/2013 | Bandic | G11C 13/0035 365/185.03 |
| 2015/0256326 A1* | 9/2015 | Simpson | H04L 7/0025 375/355 |

OTHER PUBLICATIONS

U.S. Appl. No. 14/496,416, filed Sep. 25, 2014; Entitled: Data Encoding in Solid-State Storage Apparatus.

\* cited by examiner

DATA ENCODING IN SOLID-STATE STORAGE APPARATUS

This application is a Continuation of legally related U.S. application Ser. No. 14/496,416; filed Sep. 25, 2014 and entitled: Data Encoding in Solid-State Storage Apparatus, which claims priority to Great Britain Patent Application No. 1320983.8, filed Nov. 28, 2013, and all the benefits accruing therefrom under 35 U.S.C. §119, the contents of which in its entirety are herein incorporated by reference.

BACKGROUND

This invention relates generally to data encoding in solid-state storage apparatus. Methods and apparatus are provided for encoding data for storage in solid-state memory and for decoding the stored data on readback, together with solid-state storage apparatus incorporating such systems.

In solid-state memory such as flash memory and phase-change memory, the fundamental storage unit (the "cell") can be set to q different states, or "levels", permitting storage of information. Each cell can be used to store a $q^{ary}$ symbol with each of the q possible symbol values being represented by a different cell level. In so-called "single-level cell" (SLC) devices, the memory cells can be set to only two levels (q=2) and so can record only binary values. Other devices use so-called "multi-level cells" which can be set to q>2 different cell levels, thus permitting storage of more than one bit per cell.

Detection of stored data relies on identifying the different cell levels on readback. In flash and phase change memory (PCM), for example, the different cell levels exhibit different electrical resistance characteristics which can be detected via current or voltage measurements on the cells. When reading memory cells, the read signal levels can be compared with a set of reference signal levels indicative of the q cell levels in order to determine which level each cell is set to, and thus detect the stored symbol value.

A key problem in solid-state memory technologies is a phenomenon known as "short-term drift", or simply "drift", whereby the physical quantity measured during cell readout is liable to drift with time or cell usage. In PCM, for instance, drift manifests itself as a monotonous increase of the resistance of the stored cell level with time. This drift is a stochastic process and can be data-dependent, i.e., may vary for different cell levels. As another example, the physical quantity measured in flash memory cells is the transistor's threshold voltage and this drifts upwards as a function of the number of write/erase cycles the cell is subjected to. Drift in such memory devices can severely compromise reliability. The readback values of neighboring cell levels may interfere over time, due to upwards drift of the lower level towards the upper one, causing detection errors. The closer the initial spacing between levels, the more susceptible they are to drift. Drift is therefore particularly problematical in multi-level cell (MLC) memory where there are more cell levels to be distinguished. Packing higher numbers of levels per cell becomes more difficult and prone to error during cell state detection. On the other hand, packing more bits per memory cell is a crucial requirement for all memory technologies, being the best known way to reduce the manufacturing cost per bit.

A conventional technique for dealing with drift makes use of training data derived from a pool of reference memory cells. Known information is written to the reference cells each time a block of user data is written to memory. The reference cells are then read whenever the user file is read, and the reference cell readings are used to derive estimates for the changing reference signal levels used for detection. The reference cell approach has various disadvantages, including overhead due to use of memory area for reference purposes, increased controller complexity and latency, and varying effectiveness since inherent variability between cells in a memory array means that reference cells may not be truly representative.

More sophisticated techniques for addressing drift are self-adaptive, using the readback signals from cells storing actual user data to determine the q reference levels to be used for detection of data in those cells. Self-adaptive techniques are e.g., described in U.S. Pat. No. 8,578,246 B2 as well as US patent applications publication numbers US20130166994 A1 and US20130227380 A1. These discuss drift-tolerant encoding and decoding schemes for solid-state memory devices. Drift-tolerant encoding schemes perform coding of input data using drift-tolerant codes. A "drift-tolerant code" as used herein is a code which has a particular property or properties which can be exploited to facilitate detection of stored codewords in the presence of drift. The drift-tolerant codes discussed in the above-referenced documents are permutation-based codes, i.e., codes in which all valid codewords are permutations of a vector in a known set of one or more vectors. This permutation property is exploited to permit detection of codewords in spite of drift in the readback signal levels for the q cell levels. In particular, the permutation property allows information about the drifted readback signal levels for the different memory cell levels to be derived from the read signals for a block of user data. This information, which may include the level means and/or other statistical data for the readback level distributions for the q cell levels, can then be used for codeword detection and decoding of the user data. The overall decoding task in such drift-tolerant schemes is therefore typically a dual task consisting of estimating statistical data for the readback signal levels and then using this statistical data to decode the stored data from the readback signals.

SUMMARY

In one embodiment, a method for encoding an input data block for storage in q-level cells of solid-state memory includes producing a preliminary block from the input data block by modulation encoding at least part of the input block into a first group of $q^{ary}$ symbols via a first drift-tolerant encoding scheme, the preliminary block comprising the first group of $q^{ary}$ symbols and any remainder of the input block not encoded via the first encoding scheme; generating parity data for the preliminary block via an error-correction encoding scheme; modulation encoding the parity data and any remainder of the input block into a second group of $q^{ary}$ symbols via a second drift-tolerant encoding scheme; and supplying the $q^{ary}$ symbols of the first and second groups for storage in respective q-level memory cells.

In another embodiment, a method for recording an input data block in q-level cells of solid-state memory includes encoding the input block by producing a preliminary block from the input data block by modulation encoding at least part of the input block into a first group of $q^{ary}$ symbols via a first drift-tolerant encoding scheme, the preliminary block comprising the first group of $q^{ary}$ symbols and any remainder of the input block not encoded via the first encoding scheme, generating parity data for the preliminary block via an error-correction encoding scheme, modulation encoding the parity data and any remainder of the input block into a second group of $q^{ary}$ symbols via a second drift-tolerant encoding scheme, and supplying the $q^{ary}$ symbols of the first and second groups for storage in respective q-level memory cells; and storing the $q^{ary}$ symbols of the first and second groups in respective q-level memory cells.

BRIEF DESCRIPTION OF THE DRAWINGS

Exemplary embodiments of the invention will now be described, by way of example, with reference to the accompanying drawings in which.

DETAILED DESCRIPTION

Figure 1:
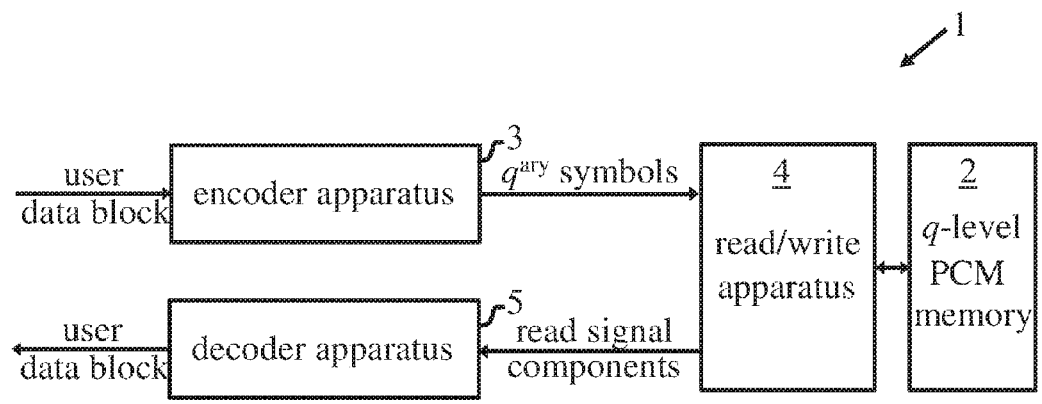
FIG. 1 is a schematic block diagram of data storage apparatus according to an embodiment of the invention.

In storage devices employing such drift-tolerant schemes, the drift-tolerant code (DTC) is typically applied as an inner modulation code which can operate efficiently on drifted signals. This inner modulation code is concatenated with an outer error-correction code (ECC). The outer ECC, which is typically based on BCH (Bose-Chaudhuri-Hocquenghem) codes, is needed to meet the low target bit-error rate (BER) required for these devices. The target BER is typically in the region of $1e^{-16}$. With such a concatenated inner/outer coding structure, the ECC encoder operates before the DTC encoder on recording, and the ECC decoder operates after the DTC decoder on readback. The inner and outer coding schemes operate on fixed-length user data blocks.

According to an embodiment of one aspect of the present invention a method for encoding an input data block for storage in q-level cells of solid-state memory is provided. The method includes producing a preliminary block from the input data block by modulation encoding at least part of the input block into a first group of $q^{ary}$ symbols via a first drift-tolerant encoding scheme, the preliminary block comprising the first group of $q^{ary}$ symbols and any remainder of the input block not encoded via the first encoding scheme; generating parity data for the preliminary block via an error-correction encoding scheme; modulation encoding the parity data and any remainder of the input block into a second group of $q^{ary}$ symbols via a second drift-tolerant encoding scheme; and supplying the $q^{ary}$ symbols of the first and second groups for storage in respective q-level memory cells.

Methods embodying the invention provide a combined inner/outer encoding system using two drift-tolerant encoding schemes to perform the modulation coding, with reverse concatenation of the first drift-tolerant encoding scheme and the error-correction encoding scheme. That is, the error-correction encoding is carried out after the first drift-tolerant encoding has modulation encoded at least part of the input data block. The second drift-tolerant encoding scheme then performs modulation encoding of both the parity data generated by the error-correction encoding and any remainder of the input block not encoded via the first encoding scheme. This dual drift-tolerant encoding system with reverse concatenation permits highly-efficient handling of the joint task of estimating statistical data for the readback levels and decoding of the stored data. The reverse concatenation arrangement inhibits error propagation on decoding of the first drift-tolerant modulation scheme because error-correction decoding is performed before the first drift-tolerant decoding stage. The first drift-tolerant decoding stage can provide reliable statistical data for the readback levels for use in the subsequent decoding. This robust estimation of the level statistics can be achieved in a highly efficient overall decoding system having limited overhead, low complexity and low latency, even for small user data blocks.

In general, each of the first and second drift-tolerant encoding schemes may utilize a single drift-tolerant code (DTC) or a combination of DTCs, and may be implemented by a single encoder or a plurality of encoders which may be distributed across a plurality of devices, e.g., across multiple memory chips. Also, each of the first and second groups of $q^{ary}$ symbols may in general comprise one or more modulation codewords produced by the corresponding drift-tolerant encoding scheme. The $q^{ary}$ symbols may be expressed in any convenient alphabet at any stage of the encoding process, and alphabet conversion (i.e., mapping of symbols to a different alphabet) may be performed as appropriate, e.g., for individual coding schemes, during the encoding process. The final $q^{ary}$ symbols output by the encoding system can be stored in respective q-level memory cells in the usual manner, whereby each symbol is recorded in a memory cell by setting the cell to a level dependent on the symbol value in accordance with the predefined mapping of symbol values to cell levels.

In the exemplary embodiments detailed below, each of the first and second drift-tolerant encoding schemes comprises a permutation-based encoding scheme, i.e., a scheme which uses at least one permutation-based code such as a code of a type described in our patent and applications referenced above. These include so-called "translation-stable" codes (discussed in U.S. Pat. No. 8,578,246 B2), SPC (single-parity-check)-based codes (discussed in US20130166994 A1), permutation modulation codes and unions of permutation modulation codes.

The first drift-tolerant encoding scheme preferably uses at least one long DTC, in particular a modulation code having a length (i.e., number of symbols in each codeword) of at least about 28 $q^{ary}$ symbols. For particularly simple and robust operation, a single permutation modulation code can be employed here. With a permutation modulation code, all codewords are permutations of a single root, or "initial", vector (where in general the code may use all, or only a subset of, the possible permutations of this vector). As discussed further below, such a code is translation stable and avoids the need to match codewords to initial vectors on decoding.

The second drift-tolerant encoding scheme preferably uses at least one drift-tolerant modulation code having a dimensionless rate of at least about 0.9. In the exemplary embodiments to be described, the second drift-tolerant encoding scheme is adapted to inhibit error propagation on decoding. For example, parity-type codes such as SPC-based codes do not give rise to error propagation on decoding. That is, any single error in a codeword at the decoder input is not propagated on decoding to produce additional errors at the decoder output. In exemplary embodiments, therefore, the second drift-tolerant encoding scheme uses at least one single-parity-check code.

An embodiment of a second aspect of the invention provides a method for recording an input data block in q-level cells of solid-state memory. The method includes encoding the input block by a method according to the first aspect of the invention; and storing the $q^{ary}$ symbols of the first and second groups in respective q-level memory cells.

In some embodiments the $q^{ary}$ symbols may be stored in cells of a single solid-state memory array. Other embodiments provide methods for recording the input data block in q-level cells of p parallel solid-state memory arrays, wherein the p parallel memory arrays have respective associated first encoders, for collectively implementing the first drift-tolerant encoding scheme, and respective associated second encoders, for collectively implementing the second drift-tolerant encoding scheme. Such a method includes partitioning the at least part of the input data block into p first portions; modulation encoding each first portion in a respective first encoder to produce a first set of $q^{ary}$ symbols, whereby the p first sets of $q^{ary}$ symbols collectively form the first group of $q^{ary}$ symbols; partitioning the parity data and any remainder of the input block into p second portions; modulation encoding each second portion in a respective second encoder to produce a second set of $q^{ary}$ symbols, whereby the p second sets of $q^{ary}$ symbols collectively form the second group of $q^{ary}$ symbols; and storing the first and second sets of $q^{ary}$ symbols output by the first and second encoders associated with each the memory array in q-level cells of that memory array.

Such methods allow a user data block to be stored in multiple parallel memory arrays with the inner, modulation encoding being performed separately for each array, e.g., by integrated encoders on individual memory chips.

An embodiment of a third aspect of the invention provides a method for recording and reproducing an input data block in q-level cells of solid-state memory. The method includes recording the input block in q-level cells of the memory by a method according to the second aspect of the invention; reading the memory cells storing the input block to obtain read signal components corresponding to respective $q^{ary}$ symbols of the first and second groups; processing the read signal components for the first group of $q^{ary}$ symbols in dependence on the first drift-tolerant encoding scheme to obtain statistical data for the distribution of the read signal components corresponding to each of the q memory cell levels; detecting at least one codeword of the first drift-tolerant encoding scheme corresponding to the read signal components for the first group of $q^{ary}$ symbols; using the statistical data to decode, in dependence on the second drift-tolerant encoding scheme, the parity data and any remainder of the input block from the read signal components for the second group of $q^{ary}$ symbols; decoding, in dependence on the error-correction encoding scheme, the preliminary block from the at least one codeword of the first drift-tolerant encoding scheme, the parity data and any remainder of the input block; and decoding the input data block from the preliminary block in dependence on the first drift-tolerant encoding scheme.

Thus, the statistical data generated on preliminary decoding of the first group of $q^{ary}$ symbols according to the first drift-tolerant encoding scheme is then used in decoding the second group of $q^{ary}$ symbols according to the second drift-tolerant encoding scheme. This allows particularly simple, efficient implementation of the decoder for the second scheme, whereby the entire decoding scheme can be implemented with low latency and low complexity. In addition, the first and second encoding schemes are preferably adapted such that the level error rate of the second scheme in the recording and reproducing method is within an order of magnitude of that of the first scheme. This gives balanced performance between the first and second encoding schemes, enhancing performance of the error correction scheme and hence performance of the system as a whole.

An embodiment of a fourth aspect of the invention provides encoder apparatus for encoding an input data block for storage in q-level cells of solid-state memory. The apparatus includes a first drift-tolerant encoding stage for modulation encoding at least part of the input block into a first group of $q^{ary}$ symbols via a first drift-tolerant encoding scheme; an error-correction encoder arranged for receiving a preliminary block, which comprises the first group of $q^{ary}$ symbols and any remainder of the input block not encoded by the first encoding stage, and adapted to generate parity data for the preliminary block in accordance with an error-correction encoding scheme; and a second drift-tolerant encoding stage for modulation encoding the parity data and any remainder of the input block into a second group of $q^{ary}$ symbols via a second drift-tolerant encoding scheme; the apparatus being adapted to supply, in use, the $q^{ary}$ symbols of the first and second groups for storage in respective q-level memory cells.

An embodiment of a fifth aspect of the invention provides encoding and decoding apparatus comprising encoder apparatus according to the fourth aspect of the invention for encoding an input data block for storage in q-level cells of solid-state memory, and decoder apparatus for decoding the input data block from read signal components, corresponding to respective $q^{ary}$ symbols of the first and second groups, obtained by reading the memory cells storing the input data block, wherein the decoder apparatus includes a level processor for processing the read signal components for the first group of $q^{ary}$ symbols in dependence on the first drift-tolerant encoding scheme to obtain statistical data for the distribution of the read signal components corresponding to each of the q memory cell levels; a detector for detecting at least one codeword of the first drift-tolerant encoding scheme corresponding to the read signal components for the first group of $q^{ary}$ symbols; a second decoder adapted to use the statistical data to decode, in dependence on the second drift-tolerant encoding scheme, the parity data and any remainder of the input block from the read signal components for the second group of $q^{ary}$ symbols; an error-correction decoder for decoding, in dependence on the error-correction encoding scheme, the preliminary block from the at least one codeword of the first drift-tolerant encoding scheme, the parity data and any remainder of the input block; and a first decoder for decoding the input data block from the preliminary block in dependence on the first drift-tolerant encoding scheme.

An embodiment of a sixth aspect of the invention provides data storage apparatus includes solid-state memory having q-level cells; encoding and decoding apparatus according to the fifth aspect of the invention; and read/write apparatus for receiving from the encoder apparatus the $q^{ary}$ symbols of the first and second groups, storing each $q^{ary}$ symbol in a respective q-level memory cell, and reading the memory cells to obtain the read signal components corresponding to respective $q^{ary}$ symbols of the first and second groups.

In general, where features are described herein with reference to an embodiment of one aspect of the invention, corresponding features may be provided in embodiments of another aspect of the invention.

FIG. 1 is a simplified schematic of data storage apparatus, here a phase-change memory (PCM) device 1, embodying the invention. The device 1 includes phase-change memory 2 for storing data in one or more integrated arrays of multilevel PCM cells. Each of the PCM cells in memory 2 can be set to one of q>2 nominal levels, designated $l_1$ to $l_q$ herein, by adjusting the resistance of the cell in known manner. Device 1 further includes encoder apparatus 3, read/write apparatus 4 and decoder apparatus 5. The encoder apparatus 3 encodes input user data into $q^{ary}$-symbol codewords as discussed further below. Read/write apparatus 4 controls writing of the resulting codewords in memory 2, and subsequent reading of memory cells to obtain read signal components corresponding to respective symbols of the stored codewords. The read/write apparatus 4 controls reading and writing of data in known manner, addressing individual memory cells for read and write purposes by applying appropriate voltages to an array of word and bit lines in memory ensemble 2. Decoder apparatus 5 processes the resulting read signal components as discussed further below to decode the readback codewords and so recover the original user data.

Though shown as a single block in the figure, in general memory 2 may comprise any desired configuration of PCM storage units ranging, for example, from a single chip or die to a plurality of storage banks each containing multiple packages of storage chips. As will be appreciated by those skilled in the art, functionality of read/write apparatus 4, encoder apparatus 3 and decoder apparatus 5 may be implemented in practice by control circuitry of a memory device, e.g., a memory chip, which forms part of memory 2, or by a separate device, such as a memory controller, which controls a set of memory devices in memory 2. In a typical arrangement, the functionality may be implemented via a combination of control logic in a memory controller and individual memory devices. The functionality of the read/write apparatus and the encoder and decoder apparatus can be implemented in general in hardware or software or a combination thereof. For reasons of operating speed, however, the use of hardwired logic circuits is generally desired to implement functionality as far as possible. Suitable implementations will be readily apparent to those skilled in the art from the description herein.

Figure 2:
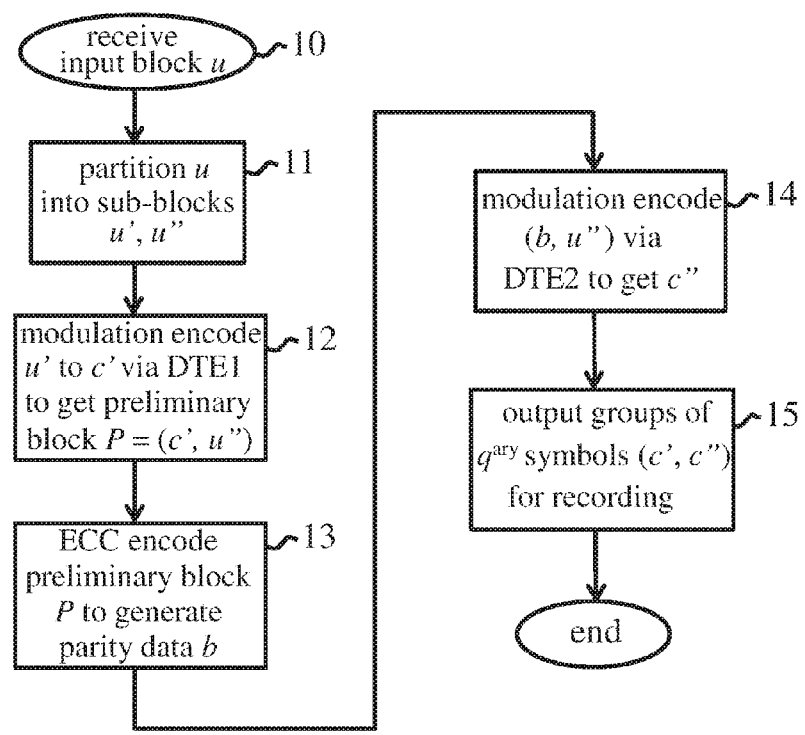
FIG. 2 indicates operation of encoder apparatus in the data storage apparatus of FIG. 1.

FIG. 2 shows the main functional steps performed by encoder apparatus 3 of device 1. Operation begins, as indicated at step 10, on receipt of a block of user data u to be recorded in memory 2. In one set of embodiments detailed below, the input block u is first partitioned into two parts, or sub-blocks, u' and u" as indicated at step 11. Next, in step 12, the first sub-block u' is modulation encoded into a first group of $q^{ary}$ symbols via a first drift-tolerant encoding scheme (DTE1). This first group of $q^{ary}$ symbols, denoted by c', may in general comprise one or more $q^{ary}$-symbol modulation codewords produced by the first modulation encoding scheme DTE1. The first group of symbols c' and the remainder of the input block u not encoded via the first encoding scheme DTE1, i.e., second sub-block u", together constitute a preliminary block P. This preliminary block P is encoded in step 13 via an error-correction encoding scheme to generate parity data for the preliminary block. The parity data, denoted by b, may in general comprise one or more parity symbols, and typically comprises a plurality of parity symbols. The symbols of the preliminary block may be expressed in any convenient alphabet for the error-correction encoding, and alphabet conversion (symbol mapping) may be performed here as discussed further below. Next, in step 14, the parity data b and the second (uncoded) sub-block u" of the input block are modulation encoded into a second group of $q^{ary}$ symbols via a second drift-tolerant encoding scheme (DTE2). The second group of $q^{ary}$ symbols, denoted by c", may in general comprise one or more $q^{ary}$-symbol modulation codewords produced by the second modulation encoding scheme DTE2. In general, the inputs b and u" to this second modulation encoding stage may be expressed in any convenient alphabet, and symbol mapping may again be performed if appropriate.

The $q^{ary}$ symbols of the aforementioned first and second groups, i.e., the set of symbols (c', c"), are then output by the encoder apparatus 3 in step 15, and the encoding process is complete.

The $q^{ary}$ symbols output by encoder 3 are stored in respective q-level cells of memory 2 by read/write apparatus 4. The q possible symbol values correspond to respective predetermined levels $l_1$ to $l_q$ of the q-level cells. Hence, each memory cell is set to a level dependent on the symbol value to be stored in accordance with the predefined correspondence between symbol values and cell levels. (Note that, when setting a cell to a given level, the actual resistance value x assumed by the cell may lie within a small interval around the nominal resistance value for the level due to write noise).

Figure 3:
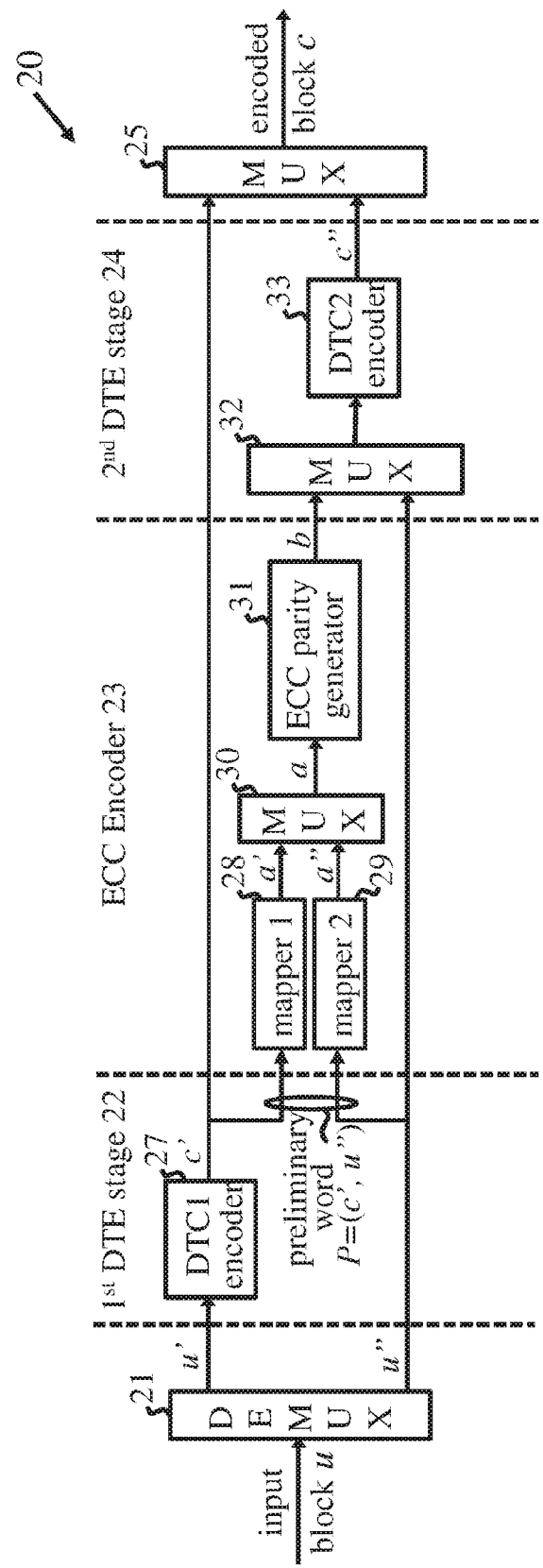
FIG. 3 is a schematic block diagram of a first embodiment of the encoder apparatus.

FIG. 3 is a generalized schematic illustrating basic structure of a first embodiment of encoder apparatus 3 for use in memory device 1. The encoder apparatus 20 of this embodiment comprises a demultiplexer (DEMUX) 21, a first drift-tolerant encoding stage indicated generally at 22, an error-correction encoder indicated generally at 23, a second drift-tolerant encoding stage indicated generally at 24, and a multiplexer (MUX) 25. Demultiplexer (DEMUX) 21 partitions the input data block u into the two sub-blocks u' and u" in accordance with step 11 of FIG. 2. The first drift-tolerant encoding stage 22 comprises a first modulation encoder 27 which is connected to receive the first sub-block u' from demultiplexer 21. This modulation encoder 27 is adapted to implement the first drift-tolerant encoding scheme. In this embodiment, the first encoding scheme is a permutation-based encoding scheme which uses a single drift-tolerant modulation code DTC1. The modulation encoded sub-block output by this encoder constitutes the first group of $q^{ary}$ symbols c'. The second sub-block u" output by demultiplexer 21 passes uncoded by the first encoding stage 22. The output of first encoding stage 22 thus consists of encoded sub-block c' and the uncoded sub-block u" which together form the preliminary block P as per step 12 of FIG. 2.

The preliminary block P produced by the first encoding stage is received by ECC encoder 23. In particular, the segments c' and u" of the preliminary block are received by respective symbol mappers 28 and 29 of the ECC encoder. These mappers map the input symbols to the alphabet of the error-correction encoding scheme as explained further below. The resulting alphabet-converted segments, denoted by a' and a" in the figure, are then combined by multiplexer 30, e.g., by simple concatenation, to produce the alphabet-converted preliminary block denoted by a in the figure. The converted preliminary block a is output to ECC parity generator 31 which generates parity data b for the preliminary block in accordance with step 13 of FIG. 2. In this embodiment, the ECC encoding scheme uses a single ECC code, specifically a BCH code, for generating the parity data.

The parity data b from ECC encoder 23 is supplied to one input of a multiplexer 32 in second drift-tolerant encoding stage 24. The other input of multiplexer 32 receives the second (uncoded) sub-block u" from first encoding stage 22. Multiplexer 32 combines (e.g., concatenates) the inputs b and u" and supplies the resulting output to a second modulation encoder 33. This encoder is adapted to implement the second drift-tolerant encoding scheme. In this embodiment, the second encoding scheme is a permutation-based encoding scheme using a single drift-tolerant modulation code DTC2. In the particular examples to follow, the code DTC2 is based on a single-parity-check. The DTC2 encoder may also perform any required symbol mapping of inputs b and u" to the alphabet of code DTC2 here. The modulation encoded output of the DTC2 encoder 33 constitutes the second group of $q^{ary}$ symbols c" in accordance with step 15 of FIG. 2.

The second group of $q^{ary}$ symbols c" from encoder stage 24 forms one input to multiplexer 25 which also receives the first group of $q^{ary}$ symbols c' from first encoder stage 22. Multiplexer 25 combines the inputs to produce the encoded output block c of encoder apparatus 20. This multiplexing operation is preferably adapted to achieve a regular distribution of the symbols of c' in the output block c.

Two encoding systems for implementation in encoding apparatus 20 will now be described in more detail. The first drift-tolerant code DTC1 in these examples is chosen to be very robust and easy to decode. In these exemplary schemes, a single long permutation modulation code is employed as DTC1. The second drift-tolerant code DTC2 is selected to have high rate and to inhibit error propagation on decoding. In these examples, a single-parity-check (SPC) code, which has essentially no error propagation, is selected as DTC2. The two codes DTC1 and DTC2 are also selected such that the level error-rate of DTC1 (without level side-information) is similar to the level error-rate of DTC2 when decoded with known level-statistics from DTC1 as described further below.

In the following encoding systems, the DTC1 and DTC2 encoders 27, 33 generate symbols $c_i \in \Lambda$. Let $\Omega$ denote the alphabet of the ECC encoding scheme and let (s', t') and (s", t") be pairs of positive integers such that $$\#\Delta^{s'} \leq \#\Omega^{t'} \qquad (1)$$

and $$2^{s''} \leq \#\Omega^{t''} \qquad (2)$$

Mapper 1 and mapper 2 are based on one-to-one mappings from to $\Delta^{s'}$ to $\Omega^{t'}$ and from $GF(2)^{s''}$ to $\Omega^{t''}$, respectively. There is a trade-off in the selection of the two pairs of integers: they are chosen to make inequalities (1) and (2) above as tight as possible, and to result in mappings with little error propagation.

Encoding System Embodiment 1

The first encoding system stores 128 byte (1024 bit) user data blocks u in (q=4)-level cells of memory 2. The reverse concatenation scheme uses a BCH outer code as the ECC code, specifically a binary (N=1130, K=1064, t=6) BCH code, whereby $\Omega$=GF(2). Inner coding is performed by a permutation modulation code DTC1 and an (SPC)-based 2-level code DTC2. Specifically, DTC1 is a length N=69, $4^{ary}$-symbol permutation modulation code with multiplicities 18, 17, 17 and 17 of the four levels, or symbol values, denoted by 0, 1, 2 and 3, respectively. This code has M codewords with $\log_2(M)$=128.8036 and, hence, a rate of 128/69 bit/cell or a dimensionless rate of 128/138 as each 4-level cell can store 2 bits. DTC2 is a 2-level single parity check inner code, denoted by SPC_q4n20, of length N=20 and rate 39/20 bit/cell or dimensionless rate 39/40. Gray coding of level symbols 0, 1, 2, 3 in $\Lambda$ provides the mapping of mapper 1; hence, s'=1 and t'=2 in inequality (1) above. Mapper 2 is based on the identity map, i.e., the bits pass unchanged and s"=1 and t"=1 in inequality (2) above.

With the foregoing system, demultiplexer 21 partitions the 1024-bit input block u into two sub-blocks u' and u" of 512 bits each. In DTC1 encoder 27, the first sub-block u' is divided into four parts of 128 bits each, and each part is encoded using DTC1 into a permutation modulation codeword of length 69. This corresponds to a total of 4×69=276 cells or, equivalently, 552 bits. Efficient encoding of the permutation modulation code in encoder 27 can be achieved using the well-known technique of enumerative encoding as discussed, for example, in "Enumerative Source Encoding", T. Cover, IEEE IT-1973.

The 512 uncoded user bits of sub-block u" and the 552 modulation encoded bits of c' output by the DTC1 encoder form a 1064-bit vector. This is encoded using the (1130, 1064, t=6) BCH code in parity generator 31 into a 1130-bit BCH codeword by appending 66 parity bits b. The 66 parity bits b and the 512 uncoded bits of sub-block u", i.e., a total of 578 bits, are encoded in DTC2 encoder 33 using the 2-level SPC code of length 20 and rate 39/20 bit/cell, resulting in an output c" comprising 15 SPC codewords, corresponding to 15×20=300 cells.

This reverse concatenated encoding system thus maps 1024 bits into 276+300=576 cells. The overhead is 576−512=64 cells, i.e., 12.5%. The overall code rate is 1024 bits/576 cells=1.78 bit/cell or 1024/1152=8/9 as dimensionless rate.

In a modification to this system using a stronger outer (N=1141, K=1064, t=7) BCH code and a 2-level SPC code of length 30, one still needs a total of only 576 cells. With a shorter 2-level SPC code of length 19, one needs a total of 580 cells, which corresponds to an overhead of 68 cells or 13.3%.

Encoding System Embodiment 2

The second encoding system stores 64 byte (512 bit) user data blocks u in (q=4)-level cells of memory 2. The reverse concatenation scheme uses a binary (N=582, K=522, t=6) BCH outer code as the ECC code, whereby $\Omega$=GF(2). Inner coding is performed by the same permutation modulation code DTC1 as the previous embodiment, and an (SPC)-based 2-level code DTC2. DTC2 is a 2-level SPC_q4n19 inner code of length N=19 and rate 37/19 bit/cell or 37/38 as dimensionless rate. Symbol mapping in mappers 28 and 29 is as for the previous embodiment.

Demultiplexer 21 partitions the 512-bit input block u into two sub-blocks u' and u" of 128 bits and 384 bits respectively. In DTC1 encoder 27, the 128-bit sub-block u' is encoded using DTC1 into a permutation modulation codeword of length 69. This corresponds to a total of 69 cells or, equivalently, 138 bits.

The 384 uncoded user bits of sub-block u″ and the 138 modulation encoded bits of c′ output by the DTC1 encoder form a 522-bit vector. This is encoded using the (582, 522, t=6) BCH code in parity generator 31 into a 582-bit BCH codeword by appending 60 parity bits b. The 60 parity bits b and the 384 uncoded bits of sub-block u″, i.e., a total of 444 bits, are encoded in DTC2 encoder 33 using the 2-level SPC code of length 19 and rate 37/19 bit/cell, resulting in an output c″ comprising 12 SPC codewords, corresponding to 12×19=228 cells.

This reverse concatenated encoding scheme thus maps 512 bits into 69+228=297 cells. The overhead is 297−256=41 cells, i.e., 16%, and the code rate is 512 bits/297 cells=1.72 bit/cell or 512/594=0.862 as dimensionless rate.

Figure 4:
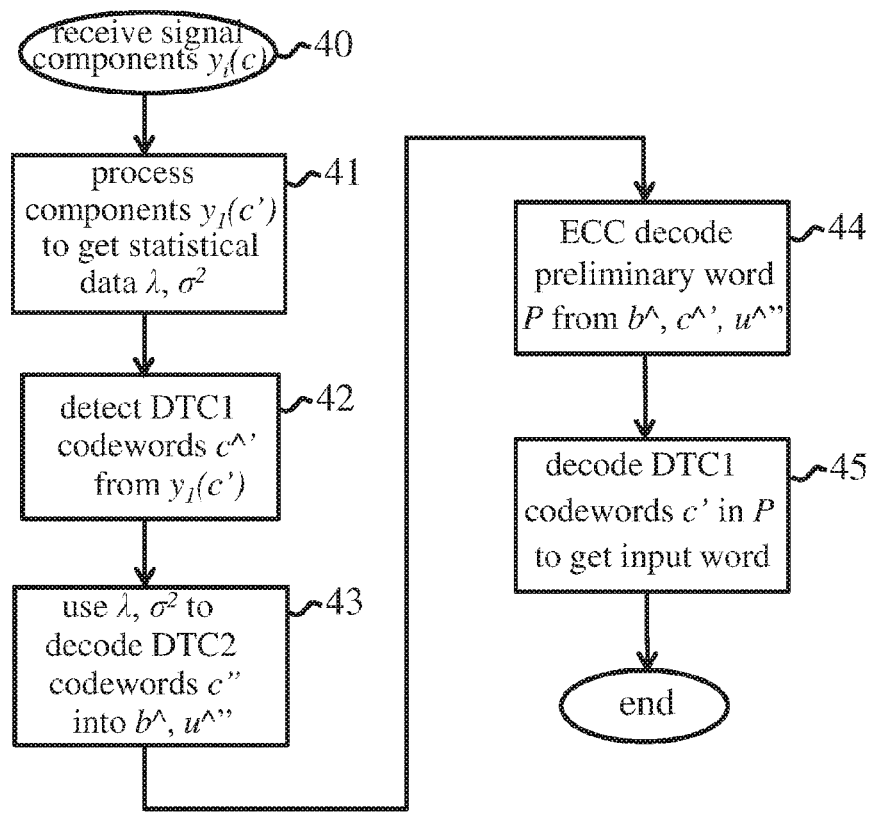
FIG. 4 indicates operation of decoder apparatus in the data storage apparatus of FIG. 1.

The operation of device 1 on reading of the encoded block c from memory 2 will now be described. In a read operation, the memory cells storing the encoded block c are read to obtain a set of real-valued read signal components $y_i(c)$ corresponding to the readback signal levels of the cells storing respective $q^{ary}$ symbols of the stored block c. Each read signal component y thus indicates the read-back resistance value of the cell storing a respective symbol of block c. The read signal components y are output by read/write apparatus 4 to decoder apparatus 5. FIG. 4 shows the main functional steps performed by the decoder apparatus 5. Operation begins on receipt of the read signal components y as indicated at step 40. In step 41, the components $y_i(c')$ corresponding to the first group of symbols c′ in encoded block c are processed in dependence on the first drift-tolerant encoding scheme DTE1 to obtain statistical data for the distribution of the read signal components corresponding to each of the q memory cell levels. In the embodiments to follow, this statistical data comprises the mean values $\lambda_1$ to $\lambda_q$ and variances $\sigma_1^2$ to $\sigma_q^2$ of the read signal component distributions for respective cell levels $l_1$ to $l_q$. This statistical data is derived as detailed below by exploiting the permutation-based property of the drift-tolerant encoding schemes to identify read signal components corresponding to the different cell levels. Next, in step 42, the decoder logic detects the DTE1 codeword(s) $\hat{c}'$ corresponding to the read signal components $y_i(c')$ for the first group of symbols c′. (The symbol ˆ here and in the following signifies an estimation of the variable in question). In step 43, the decoder uses the statistical data $\lambda$, $\sigma^2$ derived in step 41 for the q cell levels to decode the DTE2 codeword(s) contained in the read signal components $y_i(c'')$ for the second group of $q^{ary}$ symbols c″ in encoded block c. The DTE2 codeword(s) are thus decoded in dependence on the second drift-tolerant encoding scheme to obtain the parity data $\hat{b}$ and the second sub-block $\hat{u}'''$ of the input block. Next, in step 44, the preliminary block P is decoded, based on the ECC encoding scheme, from the DTE1 codeword(s) $\hat{c}'$ obtained in step 42 and the parity data $\hat{b}$ and second sub-block $\hat{u}'''$ obtained in step 43. Finally, the preliminary block P, and specifically the encoded sub-block c′ thereof, is decoded in step 45 in dependence on first encoding scheme DTE1 to obtain the first sub-block u′ which, together with the second uncoded sub-block u″ of preliminary block P, forms the recovered input block u. Decoder operation is then complete.

Figure 5:
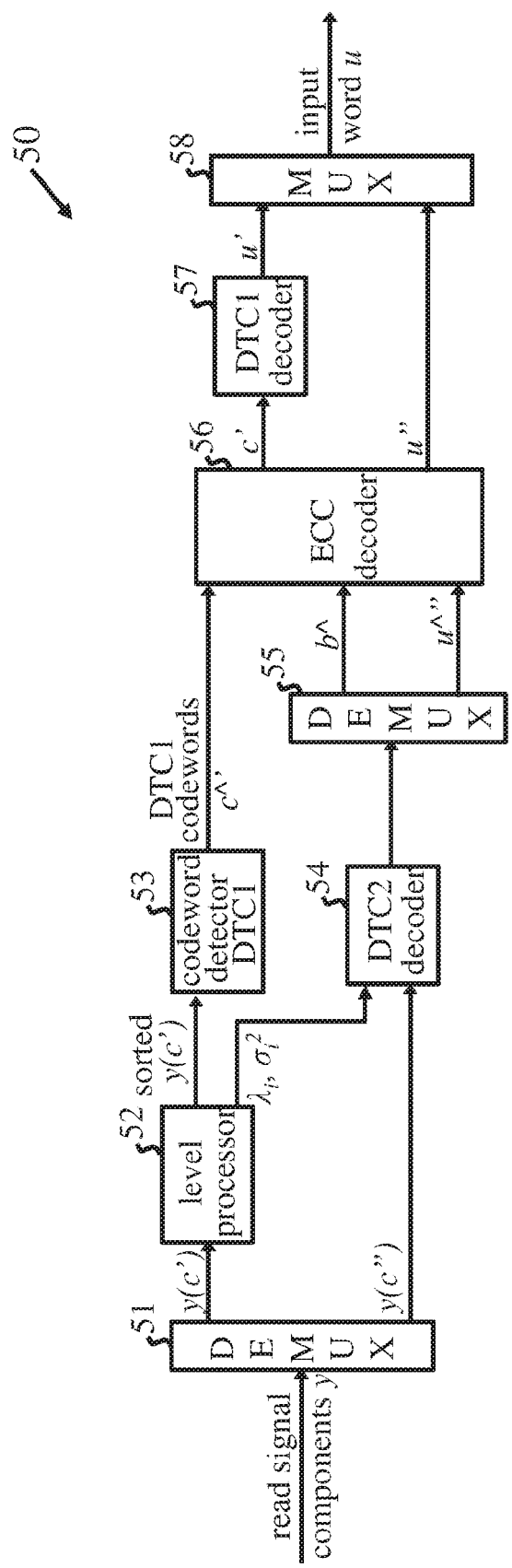
FIG. 5 is a schematic block diagram of the decoder apparatus.

FIG. 5 is a generalized schematic illustrating basic structure of an embodiment of the decoder apparatus 5 of memory device 1. The decoder apparatus 50 of this embodiment is adapted for use with the encoder apparatus 20 described above. The decoder apparatus 50 comprises a demultiplexer (DEMUX) 51 which partitions the read signal components $y_i(c)$ into the two sets $y_i(c')$ and $y_i(c'')$ corresponding to the first and second groups of $q^{ary}$ symbols in encoded block c. Output $y_i(c')$ is supplied to a level processor 52 which performs step 41 of FIG. 4 to obtain the statistical data $\lambda$, $\sigma^2$ for the q cell levels. This process, explained further below, involves a sorting operation in which the read signals corresponding to individual DTC1 codeword(s) in $y_i(c')$ are ordered according to signal level. The resulting sorted read signal components of $y_i(c')$ are supplied to codeword detector 53 which detects the DTC1 codeword(s) as per step 42 of FIG. 4. This detection step is explained further below. The output of detector 53 is thus an initial estimate $\hat{c}'$ of the DTC1 codeword(s) in symbol group c′. The second output $y_i(c'')$ from demultiplexer 51 is supplied to a DTC2 decoder 54 together with the statistical data $\lambda$, $\sigma^2$ from level processor 52. The DTC2 decoder 54 uses the statistical data to perform the DTC2 decoding in step 43 of FIG. 4, recovering the parity data $\hat{b}$ and an initial estimate $\hat{u}'''$ of the second sub-block u″, which are then separated by demultiplexer 55 for supply to ECC decoder 56. The estimated DTC1 codeword(s) $\hat{c}'$ from codeword detector 53 form the third input to ECC decoder 56. The ECC decoder 56 implements step 44 of FIG. 4 to obtain the preliminary block P comprising the two segments c′ and u″. The first segment c′ corresponds to the error-corrected DTC1 codewords. The second segment u″ corresponds to the (error-corrected) second, uncoded sub-block of the original input block. A DTC1 decoder 57 receives the first segment c′ of preliminary block P to decode the DTC1 codewords into first sub-block u′ which is combined, in multiplexer 58, with the second sub-block u″ to recover the original user block u.

Operation of the decoder apparatus 50 for the two encoding systems above is as follows.

Decoding System Embodiment 1

The read signal components $y_i(c)$ received by level processor 52 contain respective read signals $y=[y_1, y_2, \ldots, y_N]$ corresponding to the four permutation modulation codewords of length N=69. The level processor 52 first orders components of each codeword read signal y to obtain ordered read signals $r_i$ in which: $y_{i1} \leq y_{i2} \leq \ldots \leq y_{iN}$. The ordering process involves a permutation of the signal components defined by (k1, k2, . . . , kN). All DTC1 codewords are permutations of a single, known "initial vector" in which the symbols are ordered in increasing order of symbol value. The multiplicity of each of the four symbol values in this ordered vector are as defined above. Hence, the read signal components of the sorted vectors which correspond to each of the four cell levels can be determined from the known multiplicities of the corresponding symbol values in the initial vector. The means and variances $\lambda$, $\sigma^2$ of the read signal components corresponding to each cell level can thus be determined from the distribution of read signal components for that cell level.

Codeword detector 53 can detect each of the four DTC1 codewords simply by applying to the initial vector for the code the inverse of the permutation (k1, k2, . . . , kN) obtained on ordering the read signal for that codeword. The resulting codewords constitute the initial estimates of the DTC1 codeword(s) in $\hat{c}'$ output by detector 53.

In DTC 2 decoder 54, the 15 2-level SPC_q4n20 inner codewords are decoded to obtain the 512 bits providing the initial estimate $\hat{u}'''$ of the second sub-block u″ and the 66 parity bits $\hat{b}$.

ECC decoder 56 decodes the BCH code using the 552 bits corresponding to the estimated DTC1 codewords $\hat{c}'$ and the 578 bits from DTC2 decoder 54. Thus, a total of 1130 bits is decoded to obtain the four permutation modulation codewords of DTC1 in c' and 512 bits of user data corresponding to sub-block u".

DTC1 decoder 57 decodes the four DTC1 codewords in c' to retrieve the other 512 bits of user data corresponding to sub-block u'.

Decoding System Embodiment 2

The read signal components $y_i(c)$ received by level processor 52 contain one read signal $y=[y_1, y_2, \ldots, y_N]$ corresponding to the single permutation modulation codeword of DTC1. The means and variances of the read signal components corresponding to each cell level are determined from the ordered read signal as before, and the initial DTC1 codeword estimate $c^{\wedge 1}$ is determined by applying the inverse permutation (k1, k2, . . . , kN) to the initial vector as before.

In DTC 2 decoder 54, the 12 2-level SPC_q4n19 inner codewords are decoded to obtain the 384 bits providing the initial estimate $u^{\wedge"}$ of the second sub-block u" and the 60 parity bits $b^{\wedge}$.

ECC decoder 56 decodes the BCH code using the 138 bits corresponding to the estimated DTC1 codeword $c^{\wedge 1}$ and the 444 bits from DTC2 decoder 54. Thus, a total of 582 bits is decoded to obtain the permutation modulation codeword of DTC1 in c' and 384 bits of user data corresponding to sub-block u".

DTC1 decoder 57 decodes the DTC1 codeword in c' to retrieve the other 128 bits of user data corresponding to sub-block u'.

In the above decoding processes, the permutation modulation code DTC1 can be efficiently decoded based on enumerative encoding as indicated earlier. Moreover, this code is a translation-stable code as discussed in our U.S. Pat. No. 8,578,246 B2 mentioned above. This is a very robust code which provides excellent resistance to drift and accurate level statistics. The statistical data can then be used for the drift-tolerant decoding steps, and in particular by the DTC2 decoder 54 in the second drift-tolerant decoding stage above. Since the means and variances of the levels are known from the DTC1 decoding stage, decoding of the SPC-based inner code is highly efficient. The DTC2 decoder can be based, for example, on trellis decoding for a particularly simple decoder implementation. The DTC2 codes have high rate and substantially no error propagation. Moreover, the two DTC codes are selected such that the level error-rate of DTC1 (without level side-information) is similar to the level error-rate of the DTC2 when decoded with the known level-statistics from DTC1. By using two DTCs in this way, balanced performance is achieved between the permutation modulation code DTC1 and the SPC code DTC2. This provides similar protection to the first segment u' of the user data block and the second (uncoded) segment u". Moreover, the outer ECC parity symbols also benefit from this balanced protection. This ensures that at the input of the outer ECC decoder all symbols have similar error rates, permitting good performance of the BCH code and, thus, good overall performance of the entire scheme.

FIGS. 6 to 9 indicate performance of the above systems based on simulation results in which drift is modeled as a deterministic part (average trend) and a stochastic part, which is data-dependent, i.e., the read-back signal is characterized by $Y(t)=f(X,t)+W(X,t)$, where:

t is a time parameter;
the initially written and read-back signal at time $t_0$ is a random variable $X=X(t_0)$ taking on q values;

the systematic drift is modeled by an order-preserving function f(x,t) in the levels x, which is monotonically increasing in t, $t \geq t_0$;

W(x,t) is zero-mean (Gaussian) data-dependent noise at time t (with variance $\sigma^2(t,x)$).

Figure 6:
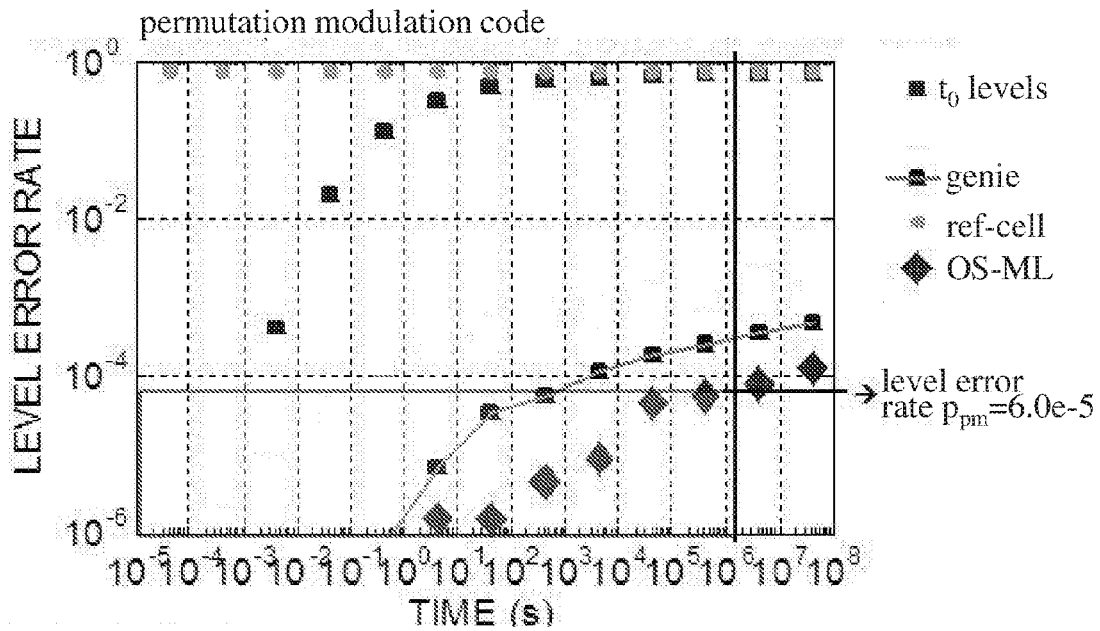
FIG. 6 indicates performance of a first drift-tolerant encoding scheme in the encoder apparatus of FIG. 3.

FIG. 6 indicates performance of the length-69 permutation modulation code in the above systems in terms of level error rate versus time for a batch size of 1 (i.e., for a single permutation modulation codeword in the readback block as per the second encoding system described above). The plot compares performance of the DTC1 code in this system with that of alternative detection systems. The trace labeled "OS-ML" corresponds to applying ordered-statistics maximum-likelihood (ML) detection to the DTC1 code as described earlier. The trace labelled "ref-cell" corresponds to detection using the reference cell technique to determine the level statistics $\lambda$, $\sigma^2$. The trace labelled "genie" corresponds to ML-based detection assuming perfect knowledge of the level statistics $\lambda$, $\sigma^2$. The trace labelled "$t_0$ levels" corresponds to MD (minimum distance)-based detection using fixed (unvarying) level means corresponding to the initial values at time t=0. The superior performance of the above scheme is clear from this figure. A level error rate of $p_{pm}=6.0 e^{-5}$ is achieved at time $t=10^6$s. The estimates for the level statistics essentially coincide with the genie estimates, even with the batch size of 1.

Figure 7:
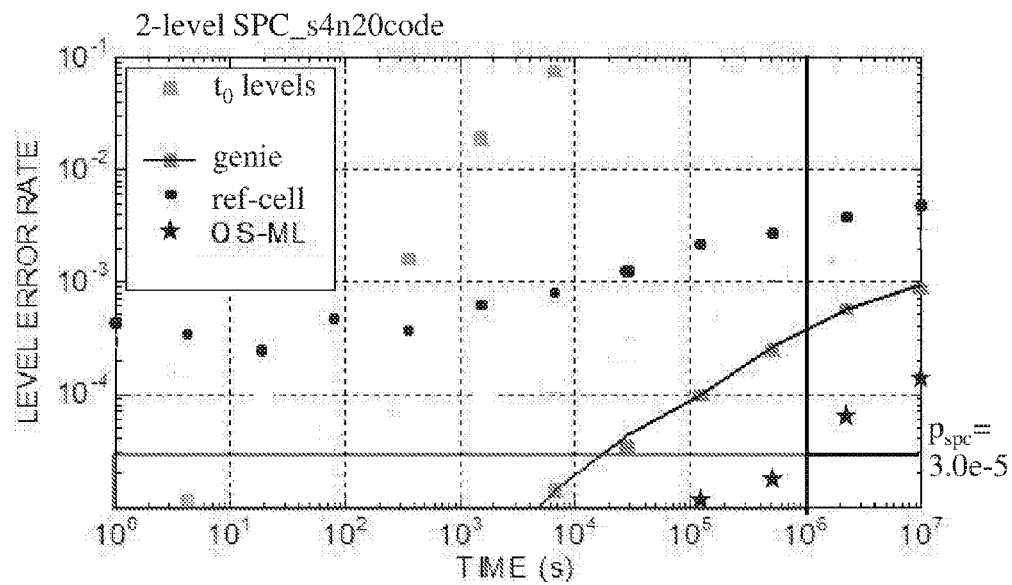
FIG. 7 indicates performance of a second drift-tolerant encoding scheme in the encoder apparatus of FIG. 3.

FIG. 7 indicates performance of the 2-level SPC_q4n20 code DTC2 in the first system above. The level error rate is compared with that of the same alternative detection systems as in FIG. 6. The superior performance of the above scheme is again clear from the figure. A level error rate of $p_{spc}=3.0 e^{-5}$ is achieved at time $t=10^6$s. The performance of the shorter 2-level SPC_q4n19 inner code in this system is even better, yielding $p_{spc}<3.0e^{-5}$.

Figure 8:
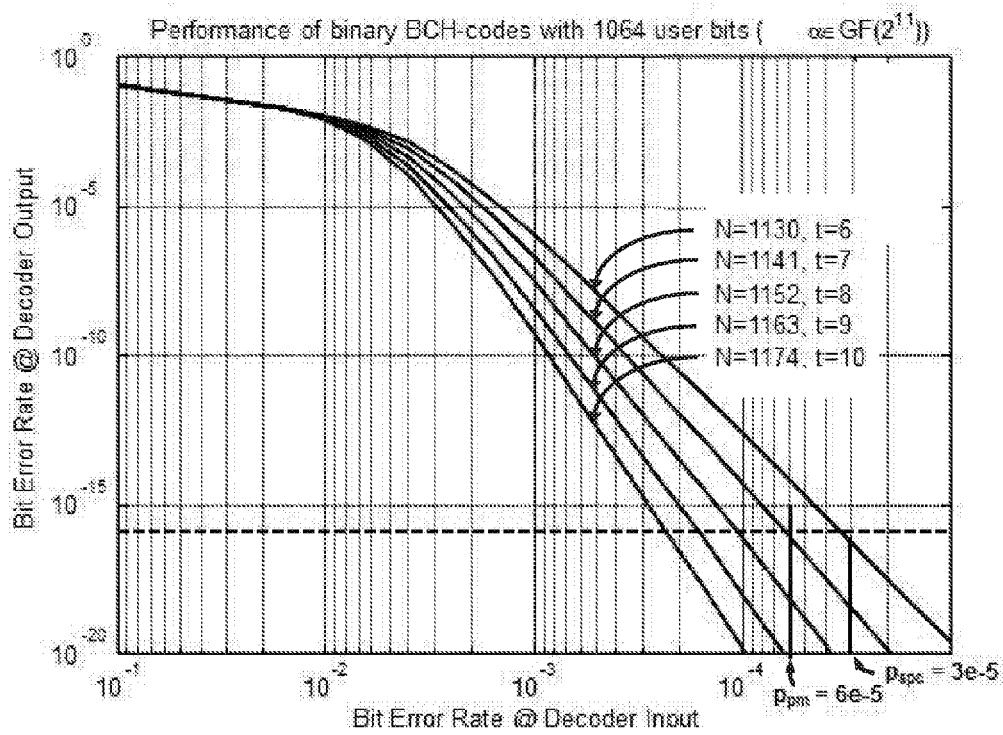
FIG. 8 indicates performance of an error-correction encoding scheme used in the encoder apparatus of FIG. 3 with the encoding schemes of FIGS. 6 and 7.

FIG. 8 indicates performance of various outer BCH codes in the above system in terms of output versus input bit error rates of the ECC decoder 56. The upper two curves correspond to the BCH (1130, 1064, t=6) and BCH (1141, 1064, t=7) codes described in relation to the first embodiment above. The error rates of DTC1 and DTC2 are indicated by vertical lines on this plot, and it can be seen that these are similar, lying well within an order of magnitude of each other. Good results are achieved with the BCH (1130, 1064, t=6) code of the upper curve, and the BCH (1141, 1064, t=7) code can achieve a target bit error of about $10^{-16}$ (as indicated by the horizontal dashed line) with this system.

Figure 9:
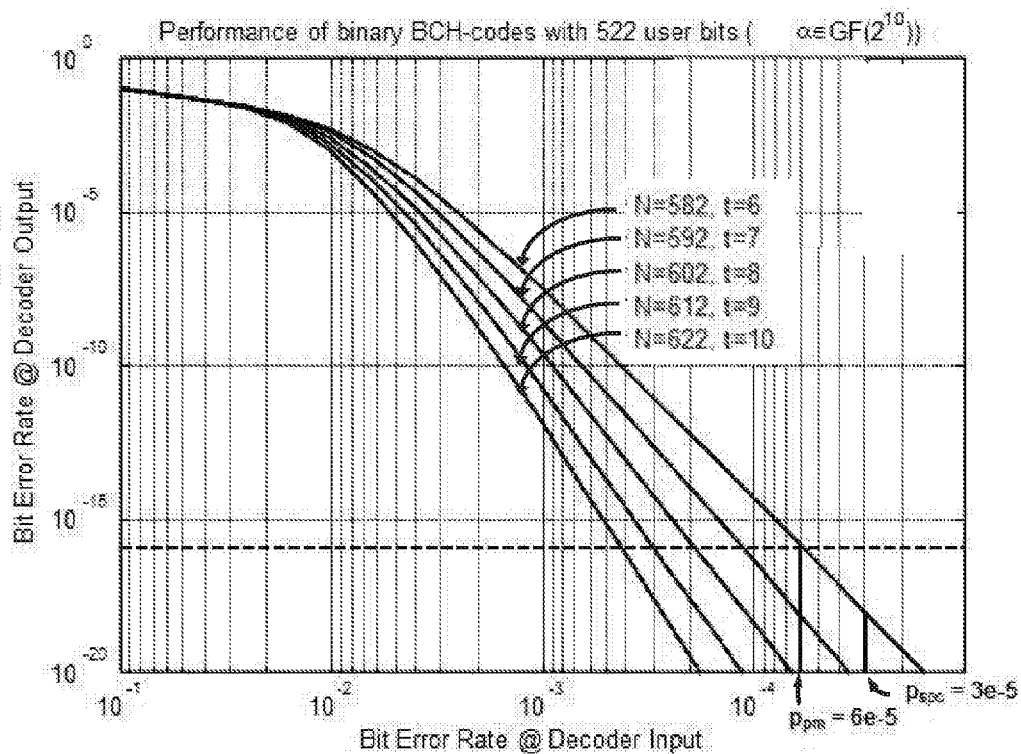
FIG. 9 indicates performance of another error-correction encoding scheme used in the encoder apparatus with alternative first and second drift-tolerant encoding schemes.

FIG. 9 shows a similar plot for outer BCH codes in the above system. The upper curve here corresponds to the BCH (582, 522, t=6) code of the second embodiment above. The error rates of DTC1 and DTC2 in this embodiment are indicated by the vertical lines on this plot. A target bit error rate of about $10^{-16}$ is again achieved with this system.

It will be seen that the above system permits exceptionally efficient handling of the joint task of estimating statistical data for the readback levels and decoding of the stored data. The use of training data (reference cells) is avoided, obviating the many disadvantages of this technique. The first drift-tolerant decoding stage provides reliable statistical data for the decoding process, and the reverse concatenation arrangement inhibits error propagation on decoding of DTC1. The overall decoding system is highly efficient, with limited overhead, low complexity and low latency. The scheme is also robust in the case of small user data blocks, e.g., 32 bytes, because DTC1 has good performance even for a batch size of 1.

As will be appreciated by those skilled in the art, the above scheme can be readily extended to accommodate higher numbers of cell levels. Moreover, for q=5, 6, 8, 12, 16 or more levels, the permutation modulation code is more efficient, i.e., has higher rate for the same length.

The input user block u in the above system can be stored, as encoded block c, in cells of a single solid-state memory array. Other embodiments permit the input data block u to be stored in cells of p parallel solid-state memory arrays. In these embodiments, the p parallel memory arrays have respective associated first encoders, for collectively implementing the first drift-tolerant encoding scheme DTE1, and respective associated second encoders, for collectively implementing the second drift-tolerant encoding scheme DTE2. In such embodiments, modulation encoding (and corresponding decoding) can be performed separately for each array, e.g., by integrated encoders/decoders on the individual memory chips. Error correction encoding/decoding, however, can be performed centrally for the parallel arrays, e.g., by a memory controller chip which controls read/write operations to the parallel arrays. The overall encoding process here corresponds generally to FIG. 2 above except that the first sub-block u' of the input block u is partitioned in step 12 into p first portions, one for each memory chip. Each of the p first portions is then modulation encoded in a respective first encoder of the corresponding memory chip to produce a first set of $q^{ary}$ symbols. The resulting p first sets of q symbols then collectively form the first group of $q^{ary}$ symbols c' in preliminary block P. ECC encoding of the preliminary block in step 13 of FIG. 2 is performed as before, in this case by the memory controller for the p memory chips. The resulting parity data and the remaining, uncoded sub-block u" of input block u are then partitioned in step 14 into p second portions which are supplied to respective memory chips. Each of the p second portions is then modulation encoded in step 14 in a respective second encoder on the corresponding memory chip to produce a second set of $q^{ary}$ symbols. The resulting p second sets of $q^{ary}$ symbols collectively form the second group of $q^{ary}$ symbols c". On each memory chip, the first and second sets of $q^{ary}$ symbols output by the first and second encoders associated with that chip are stored in the memory array on that chip. In this way, the overall encoded block c produced by the encoding scheme is distributed over the p parallel arrays for recording. Two such parallel-array implementations are described in more detail in the following.

Figure 10:
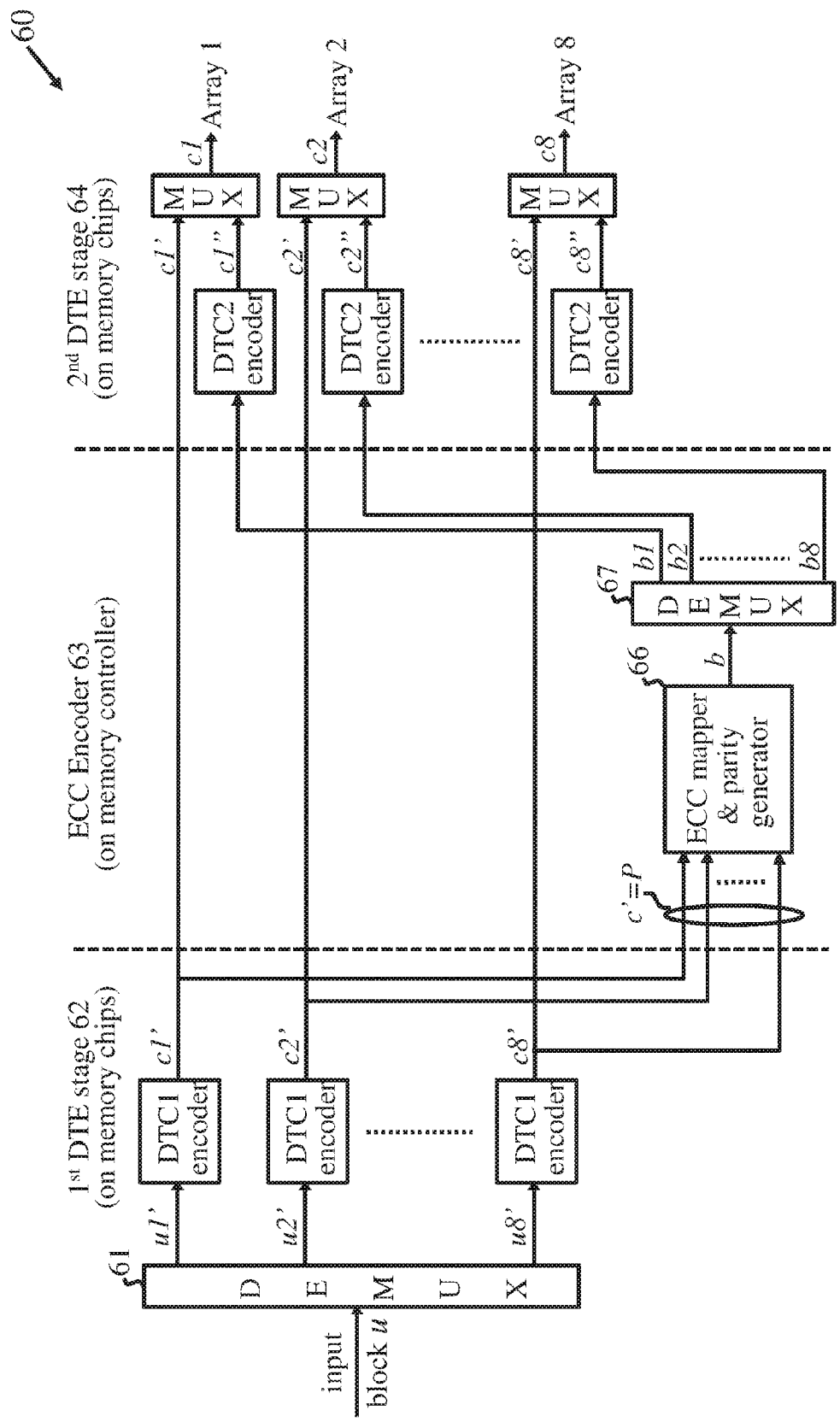
FIG. 10 is a schematic block diagram of a second embodiment of the encoder apparatus.

Encoder apparatus 60 of a first parallel-array embodiment is illustrated schematically in FIG. 10. This embodiment is adapted for storing a 64-byte (512-bit) user data block u in eight parallel PCM arrays with q=5 levels per cell. The encoder apparatus 60 comprises a demultiplexer 61, a first drift-tolerant encoding stage indicated generally at 62, an error-correction encoder indicated generally at 63, and a second drift-tolerant encoding stage indicated generally at 64. Demultiplexer 61 partitions the input data block u into eight first portions u1' to u8', each of 64 bits, which together correspond to the first sub-block u' in the method of FIG. 2. That is, in this embodiment, the second sub-block u" contains zero bits, the entire input block u being encoded as the sub-block u'. The eight first portions u1' to u8' are supplied in parallel to eight memory chips each with a corresponding memory array. The eight chips contain respective DTC1 encoders for encoding the first portions u1' to u8' of the input block into corresponding first sets of $q^{ary}$ symbols c1' to c8' using a drift-tolerant code DTC1. In this embodiment, the code DTC1 is a permutation modulation code of length 32, whereby each 64-bit portion u1' to u8' is encoded into a permutation modulation codeword c1' to c8' having 32 $5^{ary}$ symbols. The permutation modulation code DTC1 used here has multiplicities 6, 6, 6, 7 and 7 of the five levels 0, 1, 2, 3, and 4, respectively. This code has M codewords with $\log_2(M)=64.589$ and, hence, a rate of 64/32 bit/cell. Efficient encoding of the permutation modulation code can be achieved as before by enumerative encoding in the DTC1 encoders. The eight DTC1 codewords c1' to c8' correspond to a total of 8×32=256 cells ($5^{ary}$ symbols).

The eight DTC1 codewords c1' to c8' collectively form the first group of $q^{ary}$ symbols c' (which constitutes the entire preliminary word P in this case) and are supplied in parallel to ECC encoder 63 on the memory controller chip. The ECC encoder stage 63 is shown here as comprising an ECC mapper and parity generator 66, and a demultiplexer 67. The ECC encoding scheme uses an outer (316, 256, t=9) BCH code over GF(5) with 60 parity symbols. The mapping function of ECC module 66 provides a one-to-one correspondence between the q=5 levels and 5 elements of GF(5). ECC encoding is thus performed via the (316, 256, t=9) BCH code over GF(5) to generate 60 symbols of parity data b. The 256 cells ($5^{ary}$ symbols) of c' are thus mapped into a length 316 BCH codeword.

The parity symbols b are output to demultiplexer 67 which partitions the 60 parity symbols into eight second portions b1 to b8, comprising four 7-symbols portions and four 8-symbols portions. Each second portion b1 to b8 is then supplied to a respective memory chip and modulation encoded by a respective DTC2 encoder to produce a second set of $q^{ary}$ symbols c1" to c8". The eight second sets of $q^{ary}$ symbols c1" to c8" thus collectively form the second group of $q^{ary}$ symbols c". In this embodiment, the second drift-tolerant encoding scheme, implemented collectively by the eight DTC2 encoders, uses two DTC2 codes. These are single-parity-check inner codes of length N=8 and 9 over GF(5).

By using four length-8 and four length-9 codes in respective DTC2 encoders, the four 7-symbol portions b1 to b4 and the four 8-symbol portions b5 to b8 can be encoded into four 8-symbol DTC2 codewords c1" to c4" and four 9-symbol DTC2 codewords c5' to c8". On each memory chip, the DTC2 codeword c1" to c8" from the DTC2 encoder is combined with the DTC1 codeword c1' to c8' from the DTC1 encoder on that chip to produce a respective codeword segment c1 to c8. The symbols of each codeword segment c1 to c8 are then stored in respective memory cells of the memory array on the corresponding chip. Each PCM array thus stores a length-32 permutation modulation codeword c'1 to c'8 and a length-8 or -9 SPC codeword c"1 to c"8.

Figure 11:
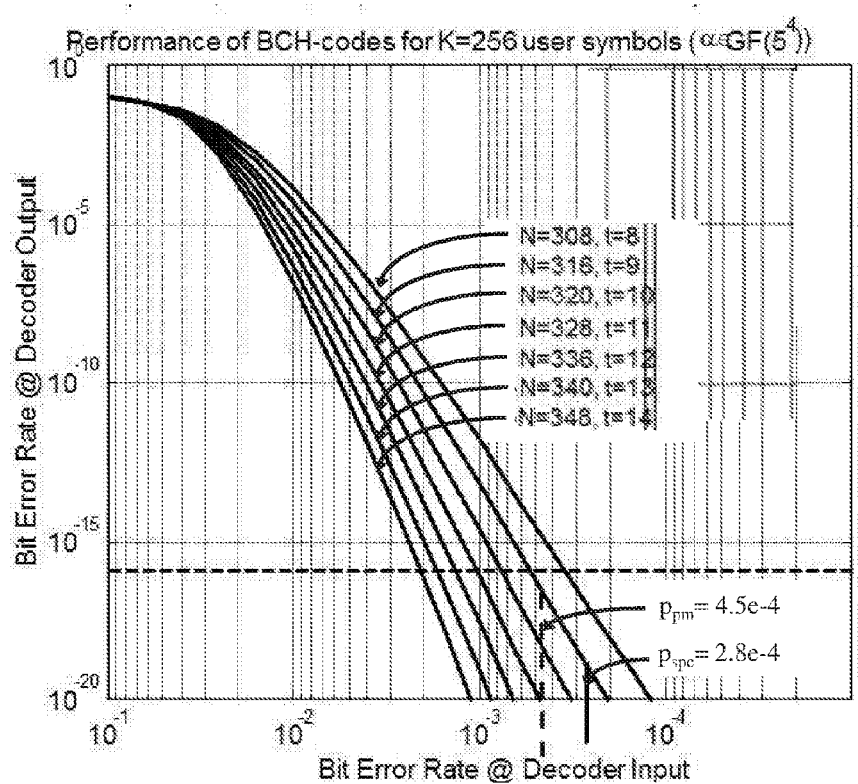
FIG. 11 indicates performance of encoding schemes used in the encoder apparatus of FIG. 10.

The above parallel-array encoding scheme maps 512 bits into 256+68=324 cells. The overhead is 324−256=68 cells, i.e., 26.5%, and the code rate=512 bits/324 cells=1.58 bit/cell. FIG. 11 indicates performance of various outer BCH codes in this system, where the second curve down corresponds to the BCH (316, 256, t=9) code above. The error rates of codes DTC1 and DTC2 are indicated by vertical lines on this plot, and it can be seen that these again lie well within an order of magnitude of each other. A target bit error rate of about $10^{-16}$, indicated by the horizontal dashed line, is readily achievable with this system.

Figure 12:
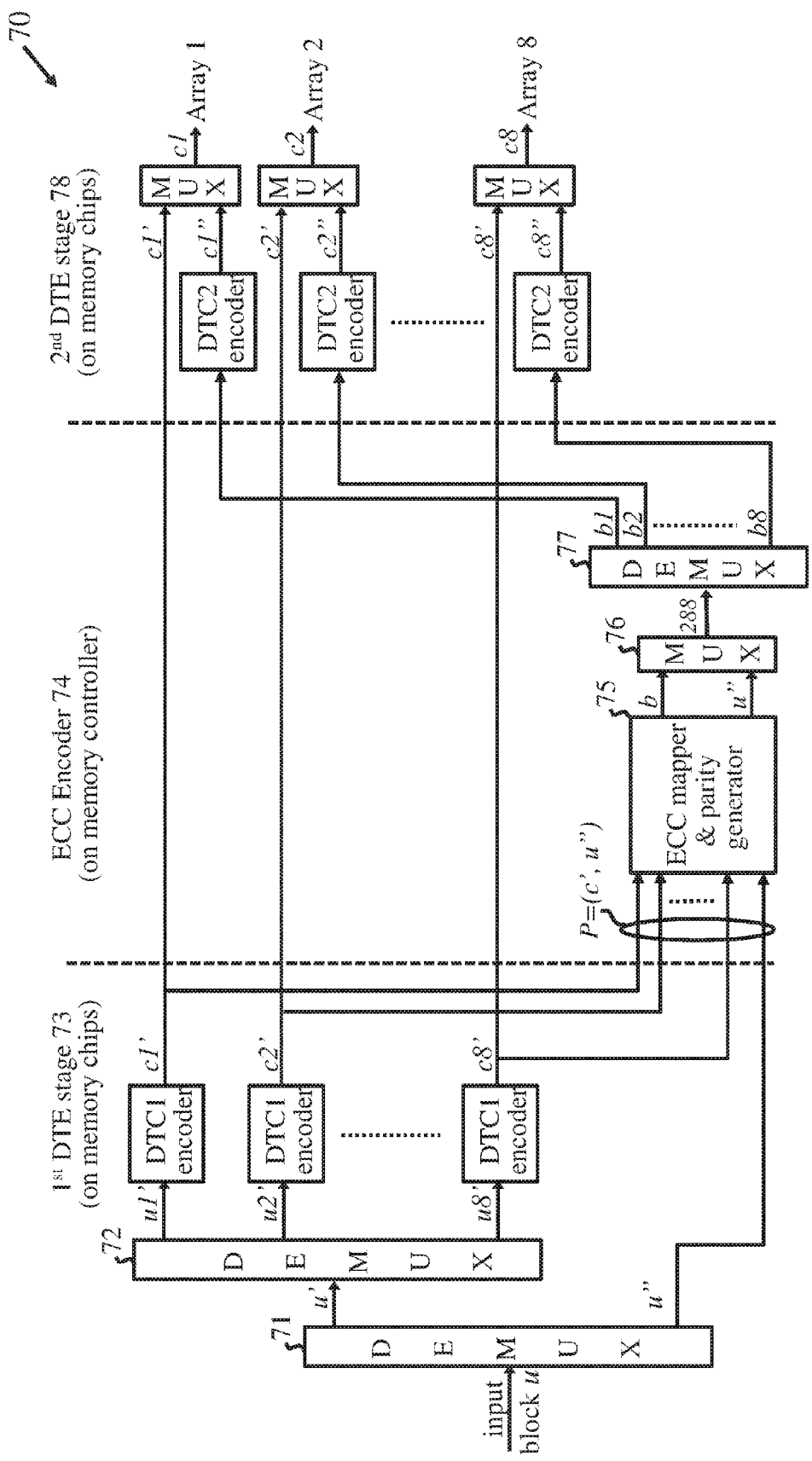
FIG. 12 is a schematic block diagram of a third embodiment of the encoder apparatus.

Encoder apparatus 70 of a second parallel-array embodiment is illustrated schematically in FIG. 12. This apparatus corresponds generally to that of FIG. 10 and only key differences are described in the following. This embodiment is adapted for storing a 128-byte (1024-bit) user data block u in eight parallel PCM arrays, again with q=5 levels per cell. In this embodiment, a first demultiplexer 71 partitions the 1024-bit input block u into sub-blocks u' and u" each of 512 bits. A second demultiplexer 72 then partitions the first sub-block u' into eight first portions u1' to u8', each of 64 bits, which are supplied in parallel respective DTC1 encoders of the eight memory chips. Each DTC1 encoder implements the same DTC1 code as the FIG. 10 system to encode the input first portion u1' to u8' into a corresponding DTC1 codeword c1' to c8' with 32 $5^{ary}$ symbols.

The eight DTC1 codewords c1' to c8' collectively form the first group of $q^{ary}$ symbols c' and are supplied in parallel to ECC encoder stage 74 on the memory controller chip. ECC encoder stage 74 also receives from demultiplexer 71 the second sub-block u" which, together with symbol-group c', forms the preliminary word P=(c', u") in this case. The ECC encoder stage 64 here includes an ECC mapper and parity generator 75 which uses an outer (544, 480, t=10) BCH code over GF(5). Using $5^7 > 2^{16}$, the mapping function of ECC module 75 maps the 512 uncoded user bits of u" into 224 5-level symbols which, together with the 256 symbols of c', form a 480 symbol vector over GF(5). This vector is ECC encoded via the (544, 480, t=10) BCH code to generate 64 symbols of parity data b. The preliminary word P=(c', u") is thus ECC encoded into a length-544 BCH codeword. The parity data b is output, together with the 224-symbol alphabet-converted sub-block u", to multiplexer 76. This multiplexes the inputs into a 288-symbol vector which is then output to demultiplexer 77. Demultiplexer 77 partitions the 288-symbol input into eight second portions b1 to b8 of 36 symbols each. Each second portion b1 to b8 is then supplied to a respective memory chip and modulation encoded by a respective DTC2 encoder to produce a second set of $q^{ary}$ symbols c1" to c8". In this embodiment, each DTC2 encoder implements an SPC code of dimension 18 and length 19 over GF(5). Thus, each symbol-set c1" to c8" consists of two 19-symbol SPC codewords. On each memory chip, the DTC2 encoder output c1" to c8" is multiplexed with the corresponding DTC1 codeword c1' to c8', and the resulting codeword segment c1 to c8 is recorded in the corresponding memory array. Each PCM array thus stores a total of 38+32=70 symbols.

Figure 13:
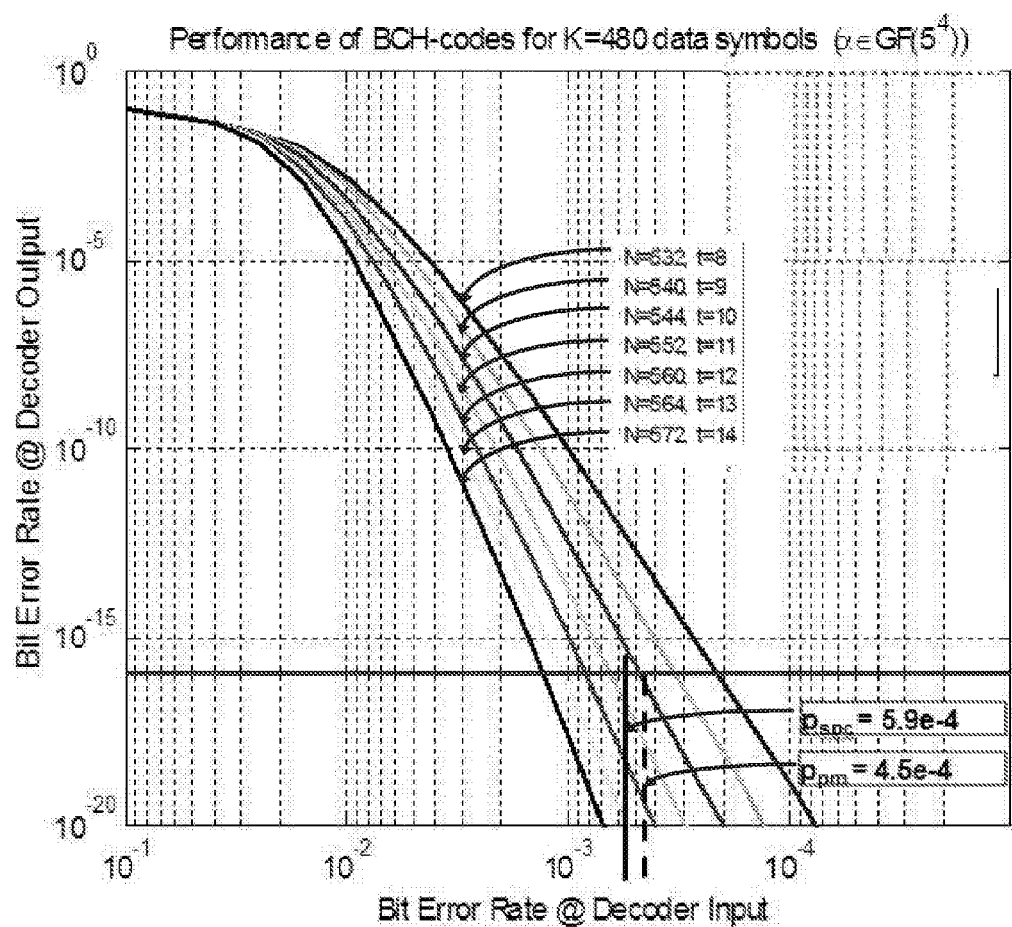
FIG. 13 indicates performance of encoding schemes used in the encoder apparatus of FIG. 12.

The above parallel-array encoding scheme maps 1024 bits into 560 cells, giving an overhead of 560−512=48 cells, i.e., 9.4%, and a code rate of 1024 bit/560 cells=1.83 bit/cell. FIG. 13 indicates the performance of outer BCH codes in the above system, where the third curve down corresponds to the BCH (544, 480, t=10) code above. The error rates of codes DTC1 and DTC2 are again indicated by vertical lines on this plot, and it can be seen that a target bit error of about $10^{-16}$ is essentially achievable with this system.

The corresponding decoding systems for the parallel-array embodiments above can be similarly distributed between the memory controller and memory chips, with the ECC decoding done by the memory controller and the DTC1 and DTC2 decoding performed on the individual memory chips. Level statistics could be determined centrally by the memory controller and supplied to all memory chips, or could be derived by individual level processors on the memory chips themselves. Either way, suitable implementations for the parallel-array decoding systems will be readily apparent from foregoing description.

While exemplary embodiments have been described above, various changes and modifications can be envisaged. For example, numerous other drift-tolerant codes might be employed for the DTE1 and DTE2 encoding schemes. Use of a single permutation modulation code for DTC1 provides simple, accurate decoding because there is only one initial vector and so no need to match codeword read signals to initial vectors for codeword detection. However, alternative embodiments might use permutation-based codes with more than one initial vector, e.g., a union of n permutation codes (whereby the set of valid codewords comprises all or a subset of the possible permutations of n initial vectors). For instance, such codes with only a small number, e.g., two, well-distinguished initial vectors may also offer simple and accurate implementation of the DTE1 scheme. Where there is more than one initial vector, codeword detection in step 42 of FIG. 4 involves matching of initial vectors to codeword read signals. This can be done in a variety of ways, e.g., using one or more detection stages using a technique such as ML (maximum-likelihood), MAP (maximum-a-posteriori) or MD (minimum distance) decoding. Particular examples of such detection processes are detailed in our US patent and US and UK patent applications referenced above, the content of which is hereby incorporated by reference herein. In general, however, any desired detection technique can be employed based on the statistical data derived for the q cell levels, and suitable implementations will be readily apparent to those skilled in the art. Such alternative techniques could also be employed in the DTE2 decoder in some embodiments.

Statistical data other than level means and variances might be envisaged for use in the decoding process, and various techniques might be used to derive the statistical data in step 41 of FIG. 4. Examples of such techniques are also described in our aforementioned patent applications incorporated herein. As a particular example here, where there is more than one codeword read signal for the encoded user block, these may be concatenated into one long vector for sorting. That is, the read signal components of this concatenated vector can be ordered according to signal level, e.g., in increasing signal level order. The resulting sorted vector can then be partitioned into q consecutive segments corresponding to respective memory cell levels. The number of components in each segment depends on predetermined frequency data indicative of expected frequency of occurrence of the corresponding memory cell level in use of the code. Such frequency data can be determined based on the known codeword probabilities and the multiplicities of the symbol values in the known set of initial vectors. This technique is described in detail in US20130227380 A1 referenced above.

While the drift-tolerant codes used in the above embodiments are permutation-based codes, other drift-tolerant codes might be envisaged for use in these systems. Moreover, though memory 2 uses PCM cells here, the techniques described are generic and can of course be applied to other memory cells. While application to multilevel cells is particularly advantageous, the techniques could also be applied to SLC memory with (q=2)-level cells.

It will be appreciated that many other changes and modifications can be made to the exemplary embodiments described without departing from the scope of the invention.

The invention claimed is:

1. A method for encoding an input data block for storage in q-level cells of solid-state memory, the method comprising:
    producing a preliminary block from the input data block by modulation encoding at least part of the input data block into a first group of q symbols via a first drift-tolerant encoding scheme, the preliminary block comprising the first group of q symbols and any remainder of the input data block not encoded via the first encoding scheme;
    generating parity data for the preliminary block via an error-correction encoding scheme;

modulation encoding the parity data and any remainder of the input data block into a second group of q symbols via a second drift-tolerant encoding scheme; and supplying the q symbols of the first group of q symbols and the second group of q symbols for storage in respective q-level memory cells.

2. The method of claim 1, wherein each of the first and second drift-tolerant encoding schemes comprises a permutation-based encoding scheme.

3. The method of claim 1, wherein the first drift-tolerant encoding scheme uses at least one drift-tolerant modulation code having a length of at least 28 q symbols.

4. The method of claim 2, wherein the first drift-tolerant encoding scheme uses a single permutation modulation code.

5. The method of claim 1, wherein the second drift-tolerant encoding scheme uses at least one drift-tolerant modulation code having a dimensionless rate of at least about 0.9.

6. The method of claim 1, wherein the second drift-tolerant encoding scheme is adapted to inhibit error propagation on decoding.

7. The method of claim 6, wherein the second drift-tolerant encoding scheme uses at least one single-parity-check code.

8. The method of claim 1, wherein the error-correction encoding scheme uses at least one BCH code.

9. A method for recording an input data block in q-level cells of solid-state memory, the method comprising:

encoding the input data block by producing a preliminary block from the input data block by modulation encoding at least part of the input data block into a first group of q symbols via a first drift-tolerant encoding scheme, the preliminary block comprising the first group of q symbols and any remainder of the input data block not encoded via the first encoding scheme, generating parity data for the preliminary block via an error-correction encoding scheme, modulation encoding the parity data and any remainder of the input data block into a second group of q symbols via a second drift-tolerant encoding scheme, and supplying the q symbols of the first and second groups for storage in respective q-level memory cells; and storing the q symbols of the first group of q symbols and second group group of q symbols in respective q-level memory cells.

10. The method of claim 9, further comprising storing the first group of q symbols and the second group of q symbols in respective cells of a single solid-state memory array.

11. The method of claim 9, further comprising:

recording the input data block in q-level cells of p parallel solid-state memory arrays, wherein the p parallel memory arrays have respective associated first encoders, for implementing the first drift-tolerant encoding scheme, and respective associated second encoders, for implementing the second drift-tolerant encoding scheme;

partitioning the at least part of the input data block into p first portions;

modulation encoding each first portion in a respective first encoder to produce a first set of q symbols, whereby the p first sets of q symbols collectively form the first group of q symbols;

partitioning the parity data and any remainder of the input data block into p second portions;

modulation encoding each second portion in a respective second encoder to produce a second set of q symbols, whereby the p second sets of q symbols collectively form the second group of q symbols; and storing the first and second sets of q symbols output by the first encoder and the second encoder associated with q-level cells in each of the p parallel memory array.

12. The method of claim 9, further comprising:

reading memory cells storing the input block to obtain read signal components corresponding to respective q symbols of the first group of q symbols and the second group of q symbols;

processing the read signal components for the first group of $q^{ary}$ symbols in dependence on the first drift-tolerant encoding scheme to obtain statistical data for the distribution of the read signal components corresponding to each of the q memory cell levels;

detecting at least one codeword of the first drift-tolerant encoding scheme corresponding to the read signal components for the first group of q symbols;

using the statistical data to decode, in dependence on the second drift-tolerant encoding scheme, the parity data and any remainder of the input block from the read signal components for the second group of q symbols;

decoding, in dependence on the error-correction encoding scheme, the preliminary block from the at least one codeword of the first drift-tolerant encoding scheme, the parity data and any remainder of the input block; and decoding the input data block from the preliminary block in dependence on the first drift-tolerant encoding scheme.

13. The method of claim 12, wherein the first drift-tolerant encoding scheme and second drift-tolerant encoding scheme are adapted such that a level error rate of the second drift-tolerant encoding scheme is within an order of magnitude of that of the first scheme.

14. An encoder apparatus for encoding an input data block for storage in q-level cells of solid-state memory, comprising:

a first drift-tolerant encoding stage for modulation encoding at least part of the input block into a first group of q symbols via a first drift-tolerant encoding scheme;

an error-correction encoder arranged for receiving a preliminary block, which comprises the first group of q symbols and any remainder of the input block not encoded by the first drift-tolerant encoding stage, and adapted to generate parity data for the preliminary block in accordance with an error-correction encoding scheme; and a second drift-tolerant encoding stage for modulation encoding the parity data and any remainder of the input block into a second group of q symbols via a second drift-tolerant encoding scheme;

the apparatus being adapted to supply the q symbols of the first group of q symbols and the second group of q symbols for storage in respective q-level memory cells.

15. The encoder apparatus of claim 14, wherein each of the first and second drift-tolerant encoding schemes comprises a permutation-based encoding scheme.

16. The encoder apparatus of claim 14, wherein the first drift-tolerant encoding scheme uses at least one drift-tolerant modulation code having a length of at least 28 q symbols.

17. The encoder apparatus of claim 16, wherein the first drift-tolerant encoding scheme uses a single permutation modulation code.

18. The encoder apparatus of claim 14, wherein the second drift-tolerant encoding scheme uses at least one drift-tolerant modulation code having a dimensionless rate of at least about 0.9.

* * * * *